US012581907B2

(12) United States Patent
Oyama et al.

(10) Patent No.: US 12,581,907 B2
(45) Date of Patent: Mar. 17, 2026

(54) FILM FOR TEMPORARY FIXATION, LAYERED PRODUCT FOR TEMPORARY FIXATION, AND METHOD FOR PRODUCING SEMICONDUCTOR DEVICE

(71) Applicant: Resonac Corporation, Tokyo (JP)

(72) Inventors: Yasuyuki Oyama, Tokyo (JP); Emi Miyazawa, Tokyo (JP); Yuta Akasu, Tokyo (JP); Shogo Sobue, Tokyo (JP)

( * ) Notice: Subject to any disclaimer, the term of this patent is extended or adjusted under 35 U.S.C. 154(b) by 344 days.

(21) Appl. No.: 18/246,855

(22) PCT Filed: Sep. 24, 2021

(86) PCT No.: PCT/JP2021/035169
§ 371 (c)(1),
(2) Date: Mar. 28, 2023

(87) PCT Pub. No.: WO2022/071150
PCT Pub. Date: Apr. 7, 2022

(65) Prior Publication Data
US 2023/0360947 A1 Nov. 9, 2023

(30) Foreign Application Priority Data

Oct. 2, 2020 (JP) ................................. 2020-167739

(51) Int. Cl.
*H01L 21/68* (2006.01)
*H01L 21/683* (2006.01)
(Continued)

(52) U.S. Cl.
CPC .......... *H01L 21/6835* (2013.01); *C08G 59/42* (2013.01); *H01L 21/30* (2013.01); *H01L 21/683* (2013.01); *H01L 2221/68386* (2013.01)

(58) Field of Classification Search
CPC ....... H01L 21/6835; H01L 2221/68386; H01L 21/568; H01L 2221/68318;
(Continued)

(56) References Cited

U.S. PATENT DOCUMENTS 9,884,979 B2 * 2/2018 Yasuda .................. C09J 163/00
9,953,945 B2 * 4/2018 Kim ........................... C09J 7/21
(Continued)

FOREIGN PATENT DOCUMENTS

JP 2009-132867 6/2009
JP 2010-212474 9/2010
(Continued)

OTHER PUBLICATIONS

International Preliminary Report on Patentability with Written Opinion dated Apr. 13, 2023 for PCT/JP2021/035169.
(Continued)

*Primary Examiner* — Vu A Vu
(74) *Attorney, Agent, or Firm* — SHIPWAY IP

(57) ABSTRACT
A film for temporary fixing used for temporarily fixing a semiconductor member and a support member contains a curable resin component. The storage modulus at 270° C. after curing of the film for temporary fixing is 1.5 to 20 MPa. The storage modulus at 25° C. after curing of the film for temporary fixing is 1.5 to 150 MPa.

20 Claims, 5 Drawing Sheets

(51) Int. Cl.
    *C08G 59/42*       (2006.01)
    *H01L 21/30*       (2006.01)

(58) Field of Classification Search
    CPC . H01L 2221/68327; H01L 2221/68381; H01L 21/30; H01L 21/304; H01L 21/683; B32B 7/023; C08G 59/42; C08L 53/02; C08L 63/00; C09J 153/02; C09J 7/10; C09J 7/387; C09J 2203/326; C09J 2301/312; C09J 2301/502
    USPC ......................................................... 438/464
    See application file for complete search history.

(56) References Cited

U.S. PATENT DOCUMENTS

| | | | | |
|---|---|---|---|---|
| 11,267,954 | B2 * | 3/2022 | Sugimoto | ................. C08L 7/00 |
| 2022/0028722 | A1 * | 1/2022 | Miyazawa | ............ H01L 21/568 |
| 2023/0044439 | A1 | 2/2023 | Yamamoto et al. | |
| 2023/0167215 | A1 * | 6/2023 | Fukao | ............... C08F 220/1804 |
| | | | | 525/327.3 |

FOREIGN PATENT DOCUMENTS

| | | |
|---|---|---|
| JP | 2010-254763 | 11/2010 |
| JP | 2012-054431 | 3/2012 |
| JP | 2012-126803 | 7/2012 |
| JP | 2013-033814 | 2/2013 |
| JP | 2015-183162 | 10/2015 |
| JP | 2015-199814 | 11/2015 |
| JP | 2016-138182 | 8/2016 |
| JP | 2018-063972 | 4/2018 |
| JP | 2018-074115 | 5/2018 |
| JP | 2020-088264 | 6/2020 |
| TW | 200308008 | 12/2003 |
| TW | 201602296 | 1/2016 |
| TW | 201936411 | 9/2019 |
| WO | 03/083002 | 10/2003 |
| WO | 2015/146312 | 10/2015 |
| WO | 2019/106846 | 6/2019 |
| WO | 2019/107508 | 6/2019 |
| WO | 2019/216262 | 11/2019 |
| WO | 2019/220540 | 11/2019 |
| WO | 2020/111146 | 6/2020 |
| WO | 2020/111154 | 6/2020 |
| WO | 2020/111193 | 6/2020 |
| WO | 2020/137980 | 7/2020 |

OTHER PUBLICATIONS

International Search Report dated Nov. 30, 2021 for PCT/JP2021/035959.
International Preliminary Report on Patentability with Written Opinion dated Apr. 13, 2023 for PCT/JP2021/035959.
Soei Patent and Law Firm, Statement of Related Matters, dated Feb. 21, 2025.
International Search Report dated Dec. 28, 2021 for PCT/JP2021/035169.

* cited by examiner

~10

FILM FOR TEMPORARY FIXATION, LAYERED PRODUCT FOR TEMPORARY FIXATION, AND METHOD FOR PRODUCING SEMICONDUCTOR DEVICE

CROSS-REFERENCE TO RELATED APPLICATIONS

This application is a 35 U.S.C. § 371 national phase application of PCT/JP2021/035169, filed on Sep. 24, 2021, which claims priority to Japanese Patent Application No. 2020-167739, filed on Oct. 2, 2020.

TECHNICAL FIELD

The present disclosure relates to a film for temporary fixing, a laminated body for temporary fixing, and a method for producing a semiconductor device.

BACKGROUND ART

In the field of semiconductor devices, in recent years, technologies related to packages called SIP (System in Package), in which a plurality of semiconductor elements are laminated, have remarkably grown. In a SIP-type package, since a large number of semiconductor elements are laminated, thickness reduction is required for the semiconductor elements. In response to this requirement, in a semiconductor element, an integrated circuit is incorporated into a semiconductor member (for example, a semiconductor wafer), and then the semiconductor member is subjected to processing treatments such as, for example, thickness reduction by grinding the back surface of the semiconductor member, and singularization by dicing the semiconductor wafer. These processing treatments for a semiconductor member are usually carried out by temporarily fixing the semiconductor member to a support member by means of a material layer for temporary fixing (see, for example, Patent Literatures 1 to 3).

The semiconductor member that has been subjected to processing treatments is strongly fixed to the support member, with the material layer for temporary fixing interposed therebetween. Therefore, in a production method for a semiconductor device, it is required that the semiconductor member after the processing treatments can be separated from the support member while preventing damage to the semiconductor member or the like. In Patent Literature 1, as a method for separating such a semiconductor member, a method of physically separating the semiconductor member while heating the material layer for temporary fixing is disclosed. Furthermore, in Patent Literatures 2 and 3, methods of separating the semiconductor member by irradiating the material layer for temporary fixing with laser light (coherent light) are disclosed.

CITATION LIST

Patent Literature

Patent Literature 1: JP 2012-126803 A
Patent Literature 2: JP 2016-138182 A
Patent Literature 3: JP 2013-033814 A

SUMMARY OF INVENTION

Technical Problem

However, in the above-described method for separating a semiconductor member, when a semiconductor member is temporarily fixed, there may be problems such as that resin components in a material layer for temporary fixing creep up on the semiconductor member, and the embeddability of the surface unevenness of the semiconductor member by the resin components in the material layer for temporary fixing is not sufficient. When such problems occur, there is a risk that an encapsulant that protects the semiconductor member may not sufficiently fill up, and the encapsulant may penetrate into the surface of the semiconductor member. In addition, in the above-described method for separating a semiconductor member, after the semiconductor member and a support member are separated, the material layer for temporary fixing may adhere onto the semiconductor member as residue. Such adhered residue can be detached by, for example, peeling or the like; however, at that time, a portion of the residue may remain on the semiconductor member as peeling residue. When peeling residue remains on the semiconductor member, there is a risk that the product yield may be lowered.

Thus, an object of the present disclosure is to provide a film for temporary fixing capable of forming a material layer for temporary fixing that can sufficiently suppress problems when a semiconductor member is temporarily fixed and can sufficiently reduce peeling residue after a semiconductor member and a support member are separated.

Solution to Problem

An aspect of the present disclosure relates to a film for temporary fixing. This film for temporary fixing is used in order to temporarily fix a semiconductor member and a support member. This film for temporary fixing contains a curable resin component. A storage modulus at 270° C. after curing of the film for temporary fixing is 1.5 to 20 MPa. According to a material layer for temporary fixing formed from a film for temporary fixing whose storage modulus at 270° C. after curing of the film for temporary fixing is in such a range (particularly, 1.5 MPa or more), problems at the time of temporarily fixing a semiconductor member can be sufficiently suppressed. Furthermore, a storage modulus at 25° C. after curing of the film for temporary fixing is 1.5 to 150 MPa. According to a material layer for temporary fixing formed from a film for temporary fixing whose storage modulus at 25° C. after curing of the film for temporary fixing is in such a range, peeling residue after separating a semiconductor member and a support member can be sufficiently reduced.

The curable resin component may include a thermoplastic resin and a thermosetting resin. In this case, the thermoplastic resin may be a hydrocarbon resin having a monomer unit derived from styrene. A content of the monomer unit derived from styrene may be 10% to 22.5% by mass based on a total amount of the hydrocarbon resin and may be 7 to 16% by mass based on the total amount of the curable resin component.

A content of the hydrocarbon resin may be 50% by mass or more based on the total amount of the thermoplastic resin.

Another aspect of the present disclosure relates to a laminated body for temporary fixing. This laminated body for temporary fixing includes a support member, a light-absorbing layer, and a material layer for temporary fixing formed from the above-described film for temporary fixing, in this order.

Another aspect of the present disclosure relates to a method for producing a semiconductor device. This method for producing a semiconductor device includes: a step of preparing the above-described laminated body for temporary fixing; a step of temporarily fixing a semiconductor member to a support member, with a material layer for temporary fixing interposed therebetween; a step of processing the semiconductor member temporarily fixed to the support member; and a step of irradiating the laminated body for temporary fixing with light through the support member side to separate the semiconductor member from the support member.

The light may be incoherent light. The incoherent light may be light including at least infrared light.

A light source of light may be a xenon lamp.

Advantageous Effects of Invention

According to the present disclosure, there is provided a film for temporary fixing capable of forming a material layer for temporary fixing that can sufficiently suppress problems at the time of temporarily fixing a semiconductor member and can sufficiently reduce peeling residue after a semiconductor member and a support member are separated. Furthermore, according to the present disclosure, a laminated body for temporary fixing that uses such a film for temporary fixing, and a method for producing a semiconductor device are provided.

DESCRIPTION OF EMBODIMENTS

Hereinafter, embodiments of the present disclosure will be described with appropriate reference to the drawings. However, the present disclosure is not intended to be limited to the following embodiments. In the following embodiments, constituent elements thereof (also including steps and the like) are not essential unless particularly stated otherwise. The sizes of the constituent elements in each diagram are conceptual, and the relative relationship between the sizes of the constituent elements is not limited as shown in each diagram.

The same also applies to numerical values and ranges thereof in the present specification, which do not limit the present disclosure. A numerical value range expressed using the term "to" in the present specification represents a range including the numerical values described before and after the term "to" as the minimum value and the maximum value, respectively. With regard to the numerical value ranges described stepwise in the present specification, the upper limit value or the lower limit value described in one numerical value range may be replaced with the upper limit value or the lower limit value of another numerical value range described stepwise. Furthermore, with regard to a numerical value range described in the present specification, the upper limit value or the lower limit value of the numerical value range may be replaced with a value shown in the Examples. Furthermore, the upper limit values and lower limit values individually described can be combined arbitrarily. Furthermore, the phrase "A or B" means that either A or B may be included, or both of them may be included. Furthermore, unless particularly stated otherwise, the materials listed below may be used singly, or two or more kinds thereof may be used in combination. When there is a plurality of substances corresponding to each component in the composition, unless particularly stated otherwise, the content of each component in the composition means the total amount of the plurality of substances present in the composition.

According to the present specification, (meth)acrylic acid means acrylic acid or methacrylic acid corresponding thereto. The same also applies to other similar expressions such as (meth)acrylate and (meth)acryloyl group.

[Film for Temporary Fixing]

Figure 1:
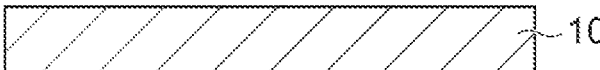
FIG. 1 is a schematic cross-sectional view illustrating an embodiment of a film for temporary fixing.

FIG. 1 is a schematic cross-sectional view illustrating an embodiment of a film for temporary fixing. The film for temporary fixing 10 shown in FIG. 1 is used for temporarily fixing a semiconductor member and a support member. More specifically, the film for temporary fixing 10 is used to form a layer (material layer for temporary fixing) intended for temporarily fixing a semiconductor member to a support member while processing the semiconductor member in the production of a semiconductor device. The film for temporary fixing 10 contains a curable resin component and may be formed from a curable resin component.

The curable resin component may be a curable resin component that is cured by heat or light. The curable resin component may be a curable resin component that is cured by heat and may be, for example, a curable resin component including a thermoplastic resin and a thermosetting resin.

The thermoplastic resin may be a resin having thermoplastic properties or a resin that has thermoplastic properties at least in an uncured state and forms a crosslinked structure after being heated.

Examples of the thermoplastic resin include a hydrocarbon resin, a polycarbonate, polyphenylene sulfide, polyethersulfone, polyetherimide, polyimide, a petroleum resin, and a novolac resin. These may be used singly or in combination of two or more kinds thereof. Among these, the thermoplastic resin may be a hydrocarbon resin.

The hydrocarbon resin is a resin in which the main skeleton is composed of a hydrocarbon. Examples of such a hydrocarbon resin include an ethylene-propylene copolymer, an ethylene-1-butene copolymer, an ethylene-propylene-1-butene copolymer elastomer, an ethylene-1-hexene copolymer, an ethylene-1-octene copolymer, an ethylene-styrene copolymer, an ethylene-norbornene copolymer, a propylene-1-butene copolymer, an ethylene-propylene-non-conjugated diene copolymer, an ethylene-1-butene-non-conjugated diene copolymer, an ethylene-propylene-1-butene-non-conjugated diene copolymer, polyisoprene, polybutadiene, a styrene-butadiene-styrene block copolymer (SBS), a styrene-isoprene-styrene block copolymer (SIS), a styrene-ethylene-butylene-styrene block copolymer (SEBS), and a styrene-ethylene-propylene-styrene block copolymer (SEPS). These hydrocarbon resins may be subjected to a hydrogenation treatment. Furthermore, these hydrocarbon resins may be carboxy-modified by means of maleic anhydride or the like. Among these, the hydrocarbon resin may include a hydrocarbon resin including a monomer unit derived from styrene (that is, a styrene-based resin) or may be a hydrocarbon resin having a monomer unit derived from styrene (that is, a styrene-based resin). More specifically, the hydrocarbon resin may include a styrene-ethylenebutylene-styrene block copolymer (SEBS) or may be a styrene-ethylene-butylene-styrene block copolymer (SEBS).

The content of the hydrocarbon resin (or styrene-based resin) may be 50% by mass or more, 70% by mass or more, or 90% by mass or more, based on the total amount of the thermoplastic resin. The content of the hydrocarbon resin (or styrene-based resin) may be 100% by mass or less based on the total amount of the thermoplastic resin. When the content of the hydrocarbon resin (or styrene-based resin) is in such a range, the storage modulus of the film for temporary fixing tends to be easily adjustable to a desired range, and the effects of the present disclosure tend to be notably exhibited. The thermoplastic resin may be composed of a hydrocarbon resin (or styrene-based resin).

The content of the styrene-based resin (or SEBS) may be 50% by mass or more, 70% by mass or more, or 90% by mass or more, based on the total amount of the hydrocarbon resin. The content of the styrene-based resin (or SEBS) may be 100% by mass or less based on the total amount of the hydrocarbon resin. When the content of the styrene-based resin (or SEBS) is in such a range, the storage modulus of the film for temporary fixing tends to be easily adjustable to a desired range, and the effects of the present disclosure tend to be notably exhibited. The hydrocarbon resin may be composed of a styrene-based resin (or SEBS).

When the hydrocarbon resin includes a styrene-based resin, the content of the monomer unit derived from styrene may be 10% to 22.5% by mass based on the total amount of the hydrocarbon resin (or thermoplastic resin). When the content of the monomer unit derived from styrene is in such a range, the storage modulus of the film for temporary fixing tends to be easily adjustable to a desired range, and the effects of the present disclosure tend to be notably exhibited. Incidentally, when two or more kinds of styrene-based resins are used in combination, the content of the monomer unit derived from styrene means the sum of the contents of the monomer units derived from styrene in the two or more kinds of styrene-based resins. The content of the monomer unit derived from styrene may be 11% by mass or more, 12% by mass or more, or 13% by mass or more, and may be 22% by mass or less or 21.5% by mass or less, based on the total amount of the hydrocarbon resin (or thermoplastic resin).

When the curable resin component includes a styrene-based rein as the thermoplastic resin (hydrocarbon resin), the content of the monomer unit derived from styrene may be 7% to 16% by mass based on the total amount of the curable resin component. When the content of the monomer unit derived from styrene is in such a range, the storage modulus of the film for temporary fixing tends to be easily adjustable to a desired range, and the effects of the present disclosure tend to be notably exhibited. Incidentally, when two or more kinds of styrene-based resins are used in combination, the content of the monomer unit derived from styrene means the sum of the contents of the monomer units derived from styrene in the two or more kinds of styrene-based resins. The content of the monomer unit derived from styrene may be 7.5% by mass or more, 8% by mass or more, or 9% by mass or more, and may be 15.5% by mass or less or 15% by mass or less, based on the total amount of the curable resin component.

The Tg of the thermoplastic resin may be −100° C. to 500° C., −50° C. to 300° C., or −50° C. to 50° C. When the Tg of the thermoplastic resin is 500° C. or lower, flexibility is easily secured when a film-shaped temporary fixing material is formed, and low-temperature sticking properties tend to be improved. When the Tg of the thermoplastic resin is −100° C. or higher, there is a tendency that deterioration in handleability and detachability caused by excessively high flexibility when a film-shaped temporary fixing material is formed, can be suppressed.

The Tg of the thermoplastic resin is a mid-point glass transition temperature value obtainable by differential scanning calorimetry (DSC). The Tg of a thermoplastic resin is specifically a mid-point glass transition temperature obtained by measuring changes in the calorific value under the conditions of a temperature increase rate of 10° C./min and a measurement temperature of −80° C. to 80° C. and calculating the mid-point glass transition temperature by the method according to JI S K 7121.

The weight average molecular weight (Mw) of the thermoplastic resin may be 10000 to 5000000 or 100000 to 2000000. When the weight average molecular weight is 10000 or more, heat resistance of the material layer for temporary fixing to be for lied tends to be easily secured. When the weight average molecular weight is 5000000 or less, a decrease in flow and deterioration in sticking properties tend to be easily suppressed when a film-shaped material layer for temporary fixing or resin layer is for lied. Incidentally, the weight average molecular weight is a polystyrene-equivalent value obtained by a gel permeation chromatography method (GPC) and calculated using a calibration curve based on polystyrene standards.

The content of the thermoplastic resin may be, for example, 40 to 90 parts by mass with respect to 100 parts by mass of the total amount of the curable resin component. The content of the thermoplastic resin may be, for example, 50 parts by mass or more or 60 parts by mass or more and may be 85 parts by mass or less or 80 parts by mass or less, with respect to 100 parts by mass of the total amount of the curable resin component. When the content of the thermoplastic resin is in such a range, the material layer for temporary fixing tends to have more excellent thin film forming properties and flatness.

A thermosetting resin is a resin that exhibits curability by heat and is a concept that does not include the above-described thermoplastic resin (hydrocarbon resin). Examples of the thermosetting resin include an epoxy resin, an acrylic resin, a silicone resin, a phenol resin, a thermosetting polyimide resin, a polyurethane resin, a melamine resin, and a urea resin. These may be used singly or in combination of two or more kinds thereof. Among these, the thermosetting resin may be an epoxy resin from the viewpoint of having more excellent heat resistance, workability, and reliability.

The epoxy resin is not particularly limited as long as it is cured and then has a heat-resistant action. Examples of the epoxy resin include bifunctional epoxy resins such as bisphenol A type epoxy; novolac type epoxy resins such as a phenol novolac type epoxy resin and a cresol novolac type epoxy resin; and alicyclic epoxy resins such as a dicyclopentadiene type epoxy resin. Furthermore, the epoxy resin may also be, for example, a polyfunctional epoxy resin, a glycidylamine type epoxy resin, or a heterocyclic-containing epoxy resin. Among these, from the viewpoints of heat resistance and weather resistance, the epoxy resin may include an alicyclic epoxy resin.

When an epoxy resin is used as the thermosetting resin, the thermosetting resin may be a combination of an epoxy resin and an epoxy resin curing agent. Regarding the epoxy resin curing agent, any known curing agent that is conventionally used can be used. Examples of the epoxy resin curing agent include an amine, a polyamide, an acid anhydride, polysulfide, boron trifluoride, bisphenols (bisphenol A, bisphenol F, bisphenol S, and the like), and phenol resins (a phenol novolac resin, a bisphenol A type novolac resin, a cresol novolac resin, a phenol aralkyl resin, and the like).

The content of the thermosetting resin may be, for example, 10 to 60 parts by mass with respect to 100 parts by mass of the total amount of the curable resin component. The content of the thermosetting resin may be, for example, 15 parts by mass or more or 20 parts by mass or more, and may be 50 parts by mass or less or 40 parts by mass or less, with respect to 100 parts by mass of the total amount of the curable resin component. When the content of the thermosetting resin is in such a range, the material layer for temporary fixing tends to have more excellent thin film forming properties and flatness.

The curable resin component may further include a curing accelerator that accelerates a curing reaction of a thermosetting resin such as an epoxy resin. Examples of the curing accelerator include an imidazole derivative, a dicyandiamide derivative, a dicarboxylic acid dihydrazide, triphenylphosphine, tetraphenylphosphonium tetraphenylborate, 2-ethyl-4-methylimidazole-tetraphenylborate, and 1,8-diazabicyclo[5,4,0]undecene-7-tetraphenylborate. These may be used singly or in combination of two or more kinds thereof.

The content of the curing accelerator may be 0.01 to 5 parts by mass with respect to 100 parts by mass of the total amount of the thermosetting resin. When the content of the curing accelerator is in such a range, the curable resin component tends to have more excellent curability and more excellent heat resistance after curing. The content of the curing accelerator may be 1.0 part by mass or more, 1.2 parts by mass or more, or 1.5 parts by mass or more, and may be 3.0 parts by mass or less, 2.5 parts by mass or less, or 2.0 parts by mass or less, with respect to 100 parts by mass of the total amount of the thermosetting resin, from the viewpoint that the storage modulus at 270° C. and the storage modulus at 25° C. can be easily adjusted to predetermined ranges.

The curable resin component may further include a polymerizable monomer and a polymerization initiator. The polymerizable monomer is not particularly limited as long as it is polymerized by heating or irradiation with ultraviolet light or the like. The polymerizable monomer may be, for example, a compound having a polymerizable functional group such as an ethylenically unsaturated group from the viewpoints of selectivity and easy availability of the material. Examples of the polymerizable monomer include a (meth)acrylate, a vinylidene halide, a vinyl ether, a vinyl ester, vinylpyridine, vinylamide, and arylated vinyl. Among these, the polymerizable monomer may be a (meth)acrylate. The (meth)acrylate may be any of a monofunctional (unifunctional), bifunctional, or trifunctional or higher-functional (meth)acrylate; however, from the viewpoint of obtaining sufficient curability, the (meth)acrylate may be a bifunctional or higher-functional (meth)acrylate.

Examples of the monofunctional (meth)acrylate include (meth)acrylic acid; aliphatic (meth)acrylates such as methyl (meth)acrylate, ethyl (meth)acrylate, butyl (meth)acrylate, isobutyl (meth)acrylate, tert-butyl (meth)acrylate, butoxyethyl (meth)acrylate, isoamyl (meth)acrylate, hexyl (meth) acrylate, 2-ethylhexyl (meth)acrylate, heptyl (meth)acrylate, octyl heptyl (meth)acrylate, nonyl (meth)acrylate, decyl (meth)acrylate 2-hydroxyethyl (meth)acrylate, 2-hydroxypropyl (meth)acrylate, 3-chloro-2-hydroxypropyl (meth) acrylate, 2-hydroxybutyl (meth)acrylate, methoxy polyethylene glycol (meth)acrylate, ethoxy polyethylene glycol (meth)acrylate, methoxy polypropylene glycol (meth)acrylate, ethoxy polypropylene glycol (meth)acrylate, and mono (2-(meth)acryloyloxyethyl) succinate; and aromatic (meth) acrylates such as benzyl (meth)acrylate, phenyl (meth) acrylate, o-biphenyl (meth)acrylate, 1-naphthyl (meth) acrylate, 2-naphthyl (meth)acrylate, phenoxyethyl (meth) acrylate, p-cumyl phenoxyethyl (meth)acrylate, o-phenyl phenoxyethyl (meth)acrylate, 1-naphthoxyethyl (meth)acrylate, 2-naphthoxyethyl (meth)acrylate, phenoxy polyethylene glycol (meth)acrylate, nonyl phenoxy polyethylene glycol (meth)acrylate, phenoxy polypropylene glycol (meth) acrylate, 2-hydroxy-3-phenoxypropyl (meth)acrylate, 2-hydroxy-3-(o-phenylphenoxy)propyl (meth)acrylate, 2-hydroxy-3-(1-naphthoxy)propyl (meth)acrylate, and 2-hydroxy-3-(2-naphthoxy)propyl (meth)acrylate.

Examples of the bifunctional (meth)acrylate include aliphatic (meth)acrylates such as ethylene glycol di(meth)acrylate, diethylene glycol di(meth)acrylate, triethylene glycol di(meth)acrylate, tetraethylene glycol di(meth)acrylate, polyethylene glycol di(meth)acrylate, propylene glycol di(meth)acrylate, dipropylene glycol di(meth)acrylate, tripropylene glycol di(meth)acrylate, tetrapropylene glycol di(meth)acrylate, polypropylene glycol di(meth)acrylate, ethoxylated polypropylene glycol di(meth)acrylate, 1,3-butanediol di(meth)acrylate, 1,4-butanediol di(meth)acrylate, neopentyl glycol di(meth)acrylate, 3-methyl-1,5-pentanediol di(meth)acrylate, 1,6-hexanediol di(meth)acrylate, 2-butyl-2-ethyl-1,3-propanediol di(meth)acrylate, 1,9-nonanediol di(meth)acrylate, 1,10-decanediol di(meth)acrylate, glycerin di(meth)acrylate, tricyclodecane dimethanol (meth)arylate, and ethoxylated 2-methyl-1,3-propanediol di(meth)acrylate; and aromatic (meth)acrylates such as ethoxylated bisphenol A type di(meth)acrylate, propoxylated bisphenol A type di(meth)acrylate, ethoxylated propoxylated bisphenol A type di(meth)acrylate, ethoxylated bisphenol F type di(meth)acrylate, propoxylated bisphenol F type di(meth)acrylate, ethoxylated propoxylated bisphenol F type di(meth)acrylate, ethoxylated fluorene type di(meth)acrylate, propoxylated fluorene type di(meth)acrylate, and ethoxylated propoxylated fluorene type di(meth) acrylate.

Examples of the polyfunctional (meth)acrylate having trifunctionality or higher functionality include aliphatic (meth)acrylates such as trimethylolpropane tri(meth)acrylate, ethoxylated trimethylolpropane tri(meth)acrylate, propoxylated trimethylolpropane tri(meth)acrylate, ethoxylated propoxylated trimethylolpropane tri(meth)acrylate, pentaerythritol tri(meth)acrylate, ethoxylated pentaerythritol tri(meth)acrylate, propoxylated pentaerythritol tri(meth) acrylate, ethoxylated propoxylated pentaerythritol tri(meth) acrylate, pentaerythritol tetra(meth)acrylate, ethoxylated pentaerythritol tetra(meth)acrylate, propoxylated pentaerythritol tetra(meth)acrylate, ethoxylated propoxylated pentaerythritol tetra(meth)acrylate, ditrimethylolpropane tetraacrylate, and dip entaerythritol hexa(meth)acrylate; and aromatic epoxy (meth)acrylates such as phenol novolac type epoxy (meth)acrylate and cresol novolac type epoxy (meth) acrylate.

These (meth)acrylates may be used singly or in combination of two or more kinds thereof. Furthermore, these (meth)acrylates may be used in combination with other polymerizable monomers.

The content of the polymerizable monomer may be 0 to 50 parts by mass with respect to 100 parts by mass of the total amount of the curable resin component.

The polymerization initiator is not particularly limited as long as it initiates polymerization by heating or irradiation with ultraviolet light or the like. For example, in the case of using a compound having an ethylenically unsaturated group as the polymerizable monomer, the polymerizable initiator may be a thermoradical polymerization initiator or a photoradical polymerization initiator.

Examples of the thermoradical polymerization initiator include diacyl peroxides such as octanoyl peroxide, lauroyl peroxide, stearyl peroxide, and benzoyl peroxide; peroxy esters such as t-butyl peroxypivalate, t-hexyl peroxypivalate, 1,1,3,3-tetramethylbutyl peroxy-2-ethylhexanoate, 2,5-dimethyl-2,5-bis(2-ethylhexanoylperoxy)hexane, t-hexyl peroxy-2-ethylhexanoate, t-butyl peroxy-2-ethylhexanoate, t-butyl peroxyisobutyrate, t-hexyl peroxyisopropyl monocarbonate, t-butyl peroxy-3,5,5-trimethylhexanoate, t-butyl peroxylaurylate, t-butyl peroxyisopropyl monocarbonate, t-butyl peroxy-2-ethylhexyl monocarbonate, t-butyl peroxybenzoate, t-hexyl peroxybenzoate, 2,5-dimethyl-2,5-bis (benzoylperoxy)hexane, and t-butyl peroxyacetate; and azo compounds such as 2,2'-azobisisobutyronitrile, 2,2'-azobis (2,4-dimethylvaleronitrile), and 2,2'-azobis(4-methoxy-2'-dimethylvaleronitrile).

Examples of the photoradical polymerization initiator include benzoin ketals such as 2,2-dimethoxy-1,2-diphenylethan-1-one; α-hydroxy ketones such as 1-hydroxycyclohexyl phenyl ketone, 2-hydroxy-2-methyl-1-phenylpropan-1-one, and 1-[4-(2-hydroxyethoxy)phenyl]-2-hydroxy-2-methyl-1-propan-1-one; and phosphine oxides such as bis (2,4,6-trimethylbenzoyl)phenyl phosphine oxide, bis(2,6-dimethoxybenzoyl)-2,4,4-trimethylpentyl phosphine oxide, and 2,4,6-trimethylbenzoyl diphenyl phosphine oxide.

These thermoradical and photoradical polymerization initiators may be used singly or in combination of two or more kinds thereof.

The content of the polymerization initiator may be 0.01 to 5 parts by mass with respect to 100 parts by mass of the total amount of the polymerizable monomers.

The curable resin component may further include an insulating filler, a sensitizer, an oxidation inhibitor, and the like as other components.

The insulating filler can be added for the purpose of imparting low thermal expansion properties, low hygroscopic properties, and the like to the material layer for temporary fixing. Examples of the insulating filler include non-metal inorganic fillers such as silica, alumina, boron nitride, titania, glass, and ceramics. These insulating fillers may be used singly or in combination of two or more kinds thereof. From the viewpoint of dispersibility in a solvent, the insulating filler may be particles having their surfaces treated with a surface treatment agent. The surface treatment agent may be, for example, a silane coupling agent.

The content of the insulating filler may be 0.1 to 20 parts by mass with respect to 100 parts by mass of the total amount of the curable resin component. When the content of the insulating filler is within the above-described range, there is a tendency that heat resistance can be further improved without interrupting light transmission. Furthermore, when the content of the insulating filler is within the above-described range, there is a possibility of contributing to light detachability.

Examples of the sensitizer include anthracene, phenanthrene, chrysene, benzopyrene, fluoranthene, rubrene, pyrene, xanthone, indanthrene, thioxanthen-9-one, 2-isopropyl-9H-thioxanthen-9-one, 4-isopropyl-9H-thioxanthen-9-one, and 1-chloro-4-propoxythioxanthone.

The content of the sensitizer may be 0.01 to 10 parts by mass with respect to 100 parts by mass of the total amount of the curable resin component. When the content of the sensitizer is within such a range, the influence on the characteristics and thin film-formability of the curable resin component tend to be small.

Examples of the oxidation inhibitor include quinone derivatives such as benzoquinone and hydroquinone; phenol derivatives (hindered phenol derivatives) such as 4-methoxyphenol and 4-t-butylcatechol; aminoxyl derivatives such as 2,2,6,6-tetramethylpiperidin-1-oxyl and 4-hydroxy-2,6,6-tetramethylpiperidin-1-oxyl; and hindered amine derivatives such as tetramethylpiperidyl methacrylate.

The content of the oxidation inhibitor may be 0.1 to 10 parts by mass with respect to 100 parts by mass of the total amount of the curable resin component. When the content of the oxidation inhibitor is within such a range, there is a tendency that degradation of the curable resin component is suppressed, and contamination can be prevented.

The thickness of the film for temporary fixing 10 may be, for example, 0.1 to 200 μm, 1 to 150 μm, or 10 to 100 μm, from the viewpoint of stress relaxation.

The shear viscosity at 100° C. of the film for temporary fixing may be, for example, 1000 Pa·s or more, 2000 Pa·s or more, or 3000 Pa·s or more, and may be 80000 Pa·s or less, 60000 Pa·s or less, 40000 Pa·s or less, or 30000 Pa·s or less. When the shear viscosity at 100° C. is in such a range, problems at the time of temporarily fixing a semiconductor member (particularly, creeping up of the resin component in the material layer for temporary fixing on a semiconductor member when the semiconductor member is disposed on the material layer for temporary fixing) can be more sufficiently suppressed. Incidentally, according to the present specification, the shear viscosity at 100° C. of the film for temporary fixing means a value measured by the method described in the Examples. That is, for the measurement of the shear viscosity, a film for temporary fixing having a thickness of 500 μm is prepared, and the shear viscosity is measured using ARES (manufactured by Rheometric Scientific, Inc.). A measurement sample is produced by punching into a diameter of 9 mm φ. Measurement is performed by increasing the temperature at a temperature increase rate of 5° C./min while applying 5% strain to the measurement sample. At this time, the value observed at 100° C. is designated as the shear viscosity at 100° C.

The shear viscosity at 100° C. of the film for temporary fixing can be increased by, for example, a method of increasing the content of a thermoplastic resin (hydrocarbon resin), or a method of applying a thermoplastic resin (hydrocarbon resin) having a high Tg.

The storage modulus at 270° C. after curing of the film for temporary fixing is 1.5 to 20 MPa. When the storage modulus at 270° C. after curing is in such a range (particularly 1.5 MPa or more), problems at the time of temporarily fixing a semiconductor member (particularly, creeping up of the resin component in the material layer for temporary fixing on a semiconductor member when the semiconductor member is disposed on the material layer for temporary fixing) can be sufficiently suppressed. The storage modulus at 270° C. after curing of the film for temporary fixing may be 1.6 MPa or more or 1.8 MPa or more, and may be 15 MPa or less, 10 MPa or less, 8 MPa or less, 5 MPa or less, or 3 MPa or less. Incidentally, in the present specification, the storage modulus at each temperature after curing of the film for temporary fixing means a value measured by curing by the method described in the Examples and measured by the method described in the Examples. That is, for the measurement of the storage modulus, a film for temporary fixing having a thickness of 500 μm is prepared, cut out into a predetermined size (20 mm in length (distance between chucks)×5.0 mm in width), and thermally cured in a clean oven (manufactured by ESPEC CORP.) under the conditions of 180° C. and 2 hours, and thereby a measurement sample, which is a cured product of the film for temporary fixing, is obtained. The storage moduli at 270° C. and 25° C. after curing of the film for temporary fixing (storage moduli at 270° C. and 25° C. of a cured product of the film for temporary fixing) are measured under the following conditions.

Apparatus name: Dynamic viscoelasticity measuring apparatus (manufactured by TA Instruments, Inc., RSA-G2)

Measured temperature region: −70° C. to 300° C.

Temperature increase rate: 5° C./min

Frequency: 1 Hz

Measurement mode: Tensile mode

The storage modulus at 25° C. after curing of the film for temporary fixing is 1.5 to 150 MPa. When the storage modulus at 25° C. after curing is in such a range, peeling residue after separating the semiconductor member and the support member can be sufficiently reduced. When the storage modulus at 25° C. after curing of the film for temporary fixing is 1.5 MPa or more, sufficient peel strength tends to be obtained. The storage modulus at 25° C. after curing of the film for temporary fixing may be 3 MPa or more, 5 MPa or more, 10 MPa or more, 12 MPa or more, 15 MPa or more, 20 MPa or more, 25 MPa or more, 30 MPa or more, 35 MPa or more, 40 MPa or more, 45 MPa or more, 50 MPa or more, or 52 MPa or more, and may be 140 MPa or less, 120 MPa or less, 110 MPa or less, 100 MPa or less, or 90 MPa or less.

The storage moduli at 270° C. and 25° C. after curing of the film for temporary fixing can be increased by, for example, methods such as increasing the content of the thermoplastic resin (hydrocarbon resin), applying a thermoplastic resin (hydrocarbon resin) having a high Tg, and adding an insulating filler to the curable resin component.

[Method for Producing Film for Temporary Fixing]

With regard to the film for temporary fixing 10, for example, first, a varnish of a curable resin component is prepared by dissolving or dispersing a component that constitutes the curable resin component by performing stirring and mixing, kneading, or the like in a solvent. Thereafter, the varnish of the curable resin component is applied on a support film that has been subjected to a release treatment, by using a knife coater, a roll coater, an applicator, a comma coater, a die coater, or the like, and then the solvent is volatilized by heating to form a film for temporary fixing formed from the curable resin component on the support film. At this time, the thickness of the film for temporary fixing can be adjusted by adjusting the amount of application of the varnish of the curable resin component.

The solvent used for the preparation of the varnish of the curable resin component is not particularly limited as long as it has characteristics capable of uniformly dissolving or dispersing each component. Examples of such a solvent include aromatic hydrocarbons such as toluene, xylene, mesitylene, cumene, and p-cymene; aliphatic hydrocarbons such as hexane and heptane; cyclic alkanes such as methylcyclohexane; cyclic ethers such as tetrahydrofuran and 1,4-dioxane; ketones such as acetone, methyl ethyl ketone, methyl isobutyl ketone, cyclohexane, and 4-hydroxy-4-methyl-2-pentanone; esters such as methyl acetate, ethyl acetate, butyl acetate, methyl lactate, ethyl lactate, and γ-butyrolactone; carbonic acid esters such as ethylene carbonate and propylene carbonate; and amides such as N,N-dimethylformamide, N,N-dimethylacetamide, and N-methyl-2-pyrrolidone. These solvents may be used singly or in combination of two or more kinds thereof. Among these, from the viewpoints of solubility and the boiling point, the solvent may be toluene, xylene, heptane, or cyclohexanone. The solid component concentration in the varnish may be 10% to 80% by mass based on the total mass of the varnish.

Stirring and mixing or kneading at the time of preparing the varnish of the curable resin component can be carried out by using, for example, a stirrer, a Raikai mixer, a three-roll, a ball mill, a bead mill, or a HomoDisper.

Examples of the support film include films of polyesters such as polyethylene terephthalate (PET), polybutylene terephthalate, and polyethylene naphthalate; polyolefins such as polyethylene and polypropylene; polycarbonate, polyamide, polyimide, polyamideimide, polyetherimide, polyether sulfide, polyethersulfone, polyether ketone, polyphenylene ether, polyphenylene sulfide, poly(meth)acrylate, polysulfone, and a liquid crystal polymer. The thickness of the support film may be, for example, 1 to 250 μm.

The heating conditions at the time of volatilizing the solvent from the varnish of the curable resin component applied on the support film can be appropriately set according to the solvent used and the like. The heating conditions may be, for example, 40° C. to 120° C. for 0.1 to 30 minutes.

[Laminated Body for Temporary Fixing]

Figure 2:
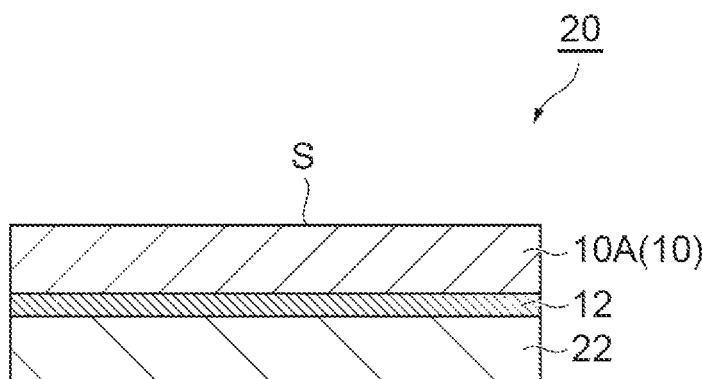
FIG. 2 is a schematic cross-sectional view illustrating an embodiment of a laminated body for temporary fixing.

FIG. 2 is a schematic cross-sectional view illustrating an embodiment of a laminated body for temporary fixing. The laminated body for temporary fixing 20 shown in FIG. 2 includes a support member 22, a light-absorbing layer 12, and a material layer for temporary fixing 10A formed from the film for temporary fixing 10, in this order. The material layer for temporary fixing 10A has a surface S of the material layer for temporary fixing 10A on the opposite side from the light absorbing layer 12.

The support member 22 is a plate-shaped body that has a high transmittance and can withstand a load received at the time of processing the semiconductor member. Examples of the support member 22 include an inorganic glass substrate and a transparent resin substrate.

The thickness of the support member 22 may be, for example, 0.1 to 2.0 mm. When the thickness of the support member 22 is 0.1 mm or more, handleability tends to be easier. When the thickness of the support member 22 is 2.0 mm or less, there is a tendency that the material cost can be suppressed.

The light-absorbing layer 12 is a layer that absorbs light and generates heat. The light-absorbing layer 12 may be, for example, a conductor layer including a conductor that absorbs light and generates heat. Examples of the conductor that constitutes the conductor layer include a metal, a metal oxide, and a conductive carbon material. The metal may be a simple metal substance such as chromium, copper, titanium, silver, platinum, or gold, or may be an alloy such as nickel-chromium, stainless steel, or copper-zinc. Examples of the metal oxide include indium tin oxide (ITO), zinc oxide, and niobium oxide. These may be used singly or in combination of two or more kinds thereof. The conductor may be chromium, titanium, or a conductive carbon material.

The light absorbing layer 12 may be a metal layer composed of a single layer or a plurality of layers, or may be, for example, a metal layer composed of a copper layer and a titanium layer.

When the light-absorbing layer 12 is a single metal layer, the light-absorbing layer 12 may include at least one metal selected from the group consisting of thallium (Ta), platinum (Pt), nickel (Ni), titanium (Ti), tungsten (W), chromium (Cr), copper (Cu), aluminum (Al), silver (Ag), and copper (Au).

The light-absorbing layer 12 is composed of two layers, namely, a first layer and a second layer, and the first layer and the second layer may be laminated in this order from the support member 22 side. In this case, for example, when the first layer has high light absorption properties and the second layer has a high thermal expansion coefficient and a high elastic modulus, satisfactory detachability tends to be easily obtained. From this viewpoint, the first layer of the light-absorbing layer 12 may include at least one metal selected from the group consisting of thallium (Ta), platinum (Pt), nickel (Ni), titanium (Ti), tungsten (W), and chromium (Cr), and the second layer of the light-absorbing layer 12 may include at least one metal selected from the group consisting of copper (Cu), aluminum (Al), silver (Ag), and gold (Au).

The thickness of the light-absorbing layer 12 may be 1 to 5000 nm, 100 to 3000 nm, or 50 to 300 nm, from the viewpoint of light detachability. When the light-absorbing layer 12 is a metal layer composed of a single layer or a plurality of layers, the thickness of the light-absorbing layer 12 (or metal layer) may be 75 nm or more, 90 nm or more, or 100 nm or more, and may be 1000 nm or less, 800 nm or less, 500 nm or less, or 300 nm or less, from the viewpoint of satisfactory detachability. When the light-absorbing layer 12 is a single metal layer, the thickness of the light-absorbing layer 12 (or metal layer) may be 100 nm or more, 125 nm or more, 150 nm or more, or 200 nm or more, and may be 1000 nm or less, 800 nm or less, or 500 nm or less, from the viewpoint of satisfactory detachability.

The material layer for temporary fixing 10A is a layer formed from the film for temporary fixing 10. The thickness of the material layer for temporary fixing 10A may be, for example, 0.1 to 200 μm, 1 to 150 μm, or 10 to 100 μm, from the viewpoint of stress relaxation.

A method for producing the laminated body for temporary fixing 20 is not particularly limited as long as a laminated body having a predetermined configuration is obtained. The laminated body for temporary fixing 20 can also be obtained by, for example, a method including a step of forming a light-absorbing layer 12 on a support member 22; and a step of sticking the above-described film for temporary fixing 10 on the light-absorbing layer 12 formed.

The light-absorbing layer 12 can be obtained by forming a metal layer on the support member 22 by physical vapor phase deposition (PVD) such as vacuum vapor deposition and sputtering, or chemical vapor phase deposition (CVD) such as plasma chemical vapor deposition. Furthermore, the light-absorbing layer 12 can also be obtained by forming a plating layer on the support member 22 by electroplating or electroless plating. According to physical vapor phase deposition, even when the support member 22 has a large area, a metal layer as the light-absorbing layer 12 that covers the surface of the support member 22 can be efficiently formed.

Examples of the method of sticking the above-described film for temporary fixing 10 onto light-absorbing layer 12 include methods such as heat pressing, roll lamination, and vacuum lamination. Lamination can be carried out, for example, under the temperature conditions of 0° C. to 120° C.

[Method for Producing Semiconductor Device]

A method for producing a semiconductor device of an embodiment includes: a step of preparing the above-described laminated body for temporary fixing (preparation step); a step of temporarily fixing a semiconductor member to a support member, with the material layer for temporary fixing interposed therebetween (temporary fixing step); a step of processing the semiconductor member temporarily fixed to the support member (processing step); and a step of irradiating the laminated body for temporary fixing with light through the support member side and then separating the semiconductor member from the support member (separation step).

(Preparation Step)

In the preparation step, while a semiconductor member is processed in order to produce a semiconductor device, the above-described laminated body for temporary fixing 20 for temporarily fixing the semiconductor member to a support member is prepared.

(Temporary Fixing Step)

Figure 3A:
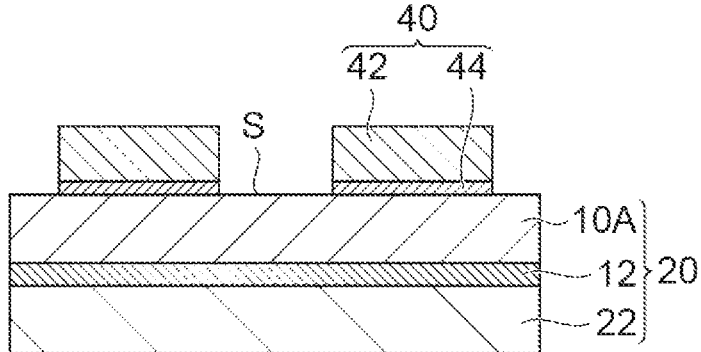
FIG. 3A and FIG. 3B are schematic cross-sectional views illustrating an embodiment of a method for producing a semiconductor device.
Figure 3B:
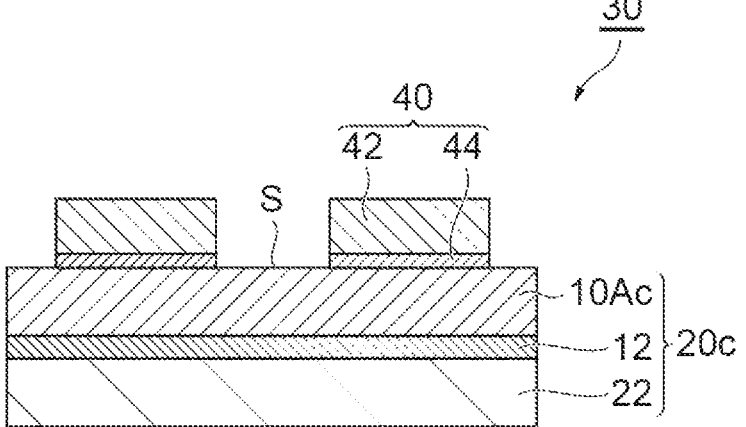

FIG. 3(*a*) and FIG. 3(*b*) are schematic cross-sectional views illustrating an embodiment of the method for producing a semiconductor device. In the temporary fixing step, a semiconductor member 40 is temporarily fixed to a support member 22, with a material layer for temporary fixing 10A interposed therebetween. The material layer for temporary fixing 10A has a surface S of the material layer for temporary fixing 10A on the opposite side from the light-absorbing layer 12. In the temporary fixing step, for example, the semiconductor member 40 can be temporarily fixed to the support member 22 (see FIG. 3(*b*)) by curing the material layer for temporary fixing 10A (film for temporary fixing 10) in a state in which the semiconductor member 40 is disposed on the material layer for temporary fixing 10A (see FIG. 3(*a*)). In other words, the semiconductor member 40 can be temporarily adhered to the support member 22, with a material layer for temporary fixing 10Ac including a cured product of the film for temporary fixing 10 (cured product of the curable resin component) interposed therebetween. In this manner, a laminated body 30 including a laminated body for temporary fixing 20c and a semiconductor member 40 provided on the laminated body for temporary fixing 20c is formed.

The semiconductor member 40 may have a semiconductor substrate 42 and a rewiring layer 44. When the semiconductor member 40 has the semiconductor substrate 42 and the rewiring layer 44, the semiconductor member 40 is temporarily fixed to the support member 22, with the material layer for temporary fixing 10A interposed therebetween, in the direction in which the rewiring layer is positioned on the material layer for temporary fixing 10A side. The semiconductor member 40 may further have an external connection terminal. The semiconductor substrate 42 may be a semiconductor wafer or a semiconductor chip obtained by dividing a semiconductor wafer. In the example of FIG. 3(*a*), a plurality of semiconductor members 40 are disposed on the surface S of the material layer for temporary fixing 10A; however, the number of the semiconductor member 40 may be one. The thickness of the semiconductor member 40 may be 1 to 1000 μm, 10 to 500 μm, or 20 to 200 μm, from the viewpoint of suppressing cracking during conveyance and at the time processing step or the like, in addition to miniaturization and thickness reduction of semiconductor devices.

The semiconductor member 40 disposed on the material layer for temporary fixing 10A is pressure-bonded to the material layer for temporary fixing 10A by using, for example, a vacuum pressing machine or a vacuum laminator. In the case of using a vacuum pressing machine, the conditions for pressure-bonding may be an air pressure of 1 hPa or less, a pressure-bonding pressure of 1 MPa, a pressure-bonding temperature of 120° C. to 200° C., and a retention time of 100 to 300 seconds. In the case of using a vacuum laminator, the conditions for pressure-bonding may be, for example, an air pressure of 1 hPa or less, a pressure-bonding temperature of 60° C. to 180° C. or 80° C. to 150° C., a lamination pressure of 0.01 to 1.0 MPa or 0.1 to 0.7 MPa, and a retention time of 1 to 600 seconds or 30 to 300 seconds.

After the semiconductor member 40 is disposed on the material layer for temporary fixing 10A, by thermally curing or photocuring the material layer for temporary fixing 10A (curable resin component), the semiconductor member 40 is temporarily fixed to the support member 22, with the material layer for temporary fixing 10Ac including a cured product of the film for temporary fixing 10 (cured product of the curable resin component) interposed therebetween. The conditions for thermal curing may be, for example, 300° C. or lower or 100° C. to 250° C. for 1 to 180 minutes or 1 to 120 minutes.

(Processing Step)

Figure 4A:
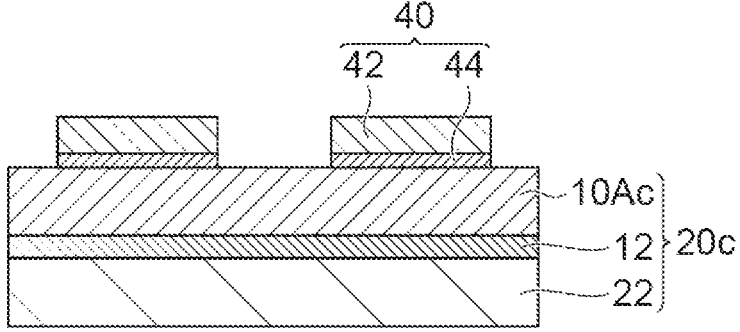
FIG. 4A, FIG. 4B, and FIG. 4C are schematic cross-sectional views illustrating an embodiment of the method for producing a semiconductor device.
Figure 4B:
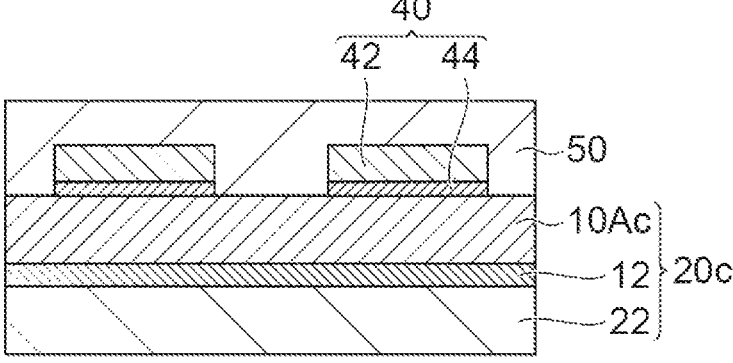
Figure 4C:
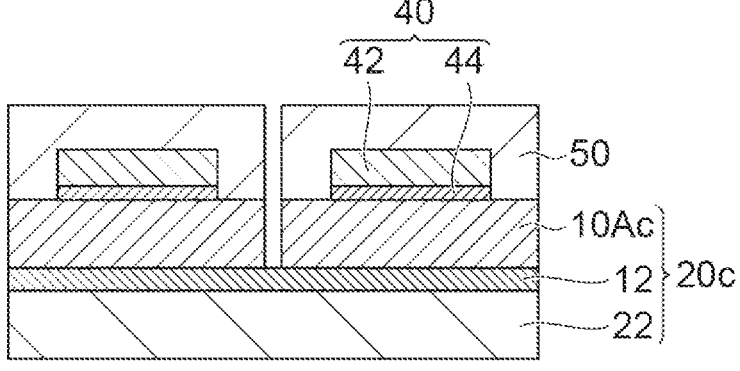

FIG. 4(*a*), FIG. 4(*b*), and FIG. 4(*c*) are schematic cross-sectional views illustrating an embodiment of the method for producing a semiconductor device. In the processing step, the semiconductor member 40 temporarily fixed to the support member 22 is processed. FIG. 4(*a*) shows an example of processing including thinning of the semiconductor substrate. Processing of the semiconductor member is not limited to this and can include, for example, thinning of the semiconductor substrate, division (dicing) of the semiconductor member, formation of a through electrode (through-silicon via), an etching treatment, a plating reflow treatment, a sputtering treatment, or a combination of these.

After the processing of the semiconductor member 40, as shown in FIG. 4(*b*), an encapsulation layer 50 that encapsulates the processed semiconductor member 40 is formed. The encapsulation layer 50 can be formed by using an encapsulant that is conventionally used for the production of a semiconductor element. For example, the encapsulation layer 50 may be formed by means of a thermosetting resin composition. Examples of the thermosetting resin composition that is used for the encapsulation layer 50 include epoxy resins such as a cresol novolac epoxy resin, a phenol novolac epoxy resin, a biphenyl diepoxy resin, and a naphthol novolac epoxy resin. The encapsulation layer 50 and the thermosetting resin composition for forming the encapsulation layer 50 may include a filler and/or additives such as a flame retardant.

The encapsulation layer 50 is formed by using, for example, a solid material, a liquid material, a fine granular material, or an encapsulation film. In the case of using an encapsulation film, a compression encapsulation molding machine, a vacuum lamination apparatus, and the like are used. For example, the encapsulation layer 50 can be formed by coating the semiconductor member 40 with an encapsulation film that has been thermally melted using these apparatuses under the conditions of 40° C. to 180° C. (or 60° C. to 150° C.) and 0.1 to 10 MPa (or 0.5 to 8 MPa) for 0.5 to 10 minutes. The thickness of the encapsulation film is adjusted such that the encapsulation layer 50 has a thickness equal to or greater than the thickness of the semiconductor member 40 after processing. The thickness of the encapsulation film may be 50 to 2000 μm, 70 to 1500 μm, or 100 to 1000 μm.

After the encapsulation layer 50 is formed, as shown in FIG. 4(*c*), the encapsulation layer 50 and the material layer for temporary fixing 10Ac may be divided into a plurality of portions each including one semiconductor member 40.

(Separation Step)

Figure 5A:
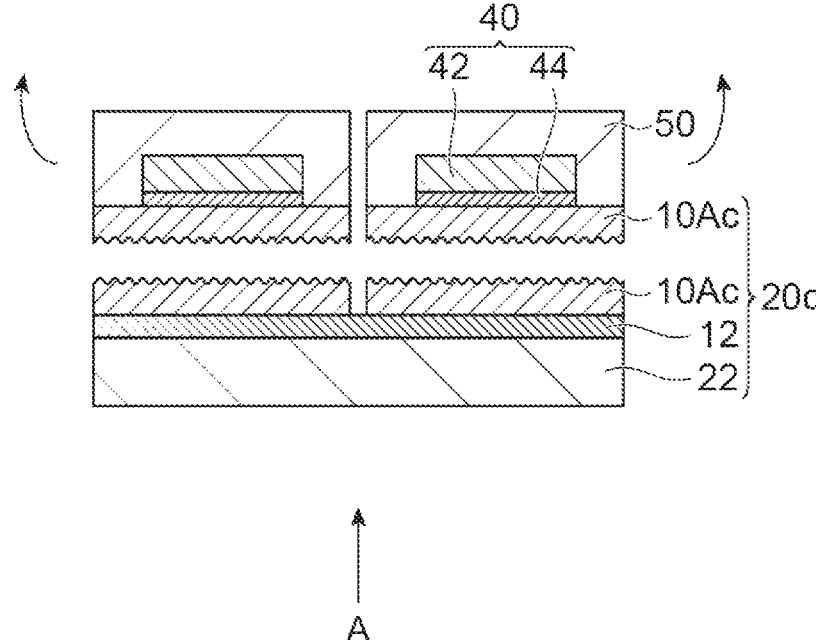
FIG. 5A and FIG. 5B are schematic cross-sectional views illustrating an embodiment of the method for producing a semiconductor device.
Figure 5B:
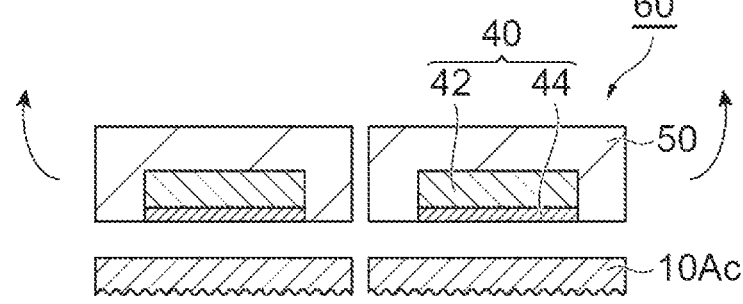

FIG. 5(*a*) and FIG. 5(*b*) are schematic cross-sectional views illustrating an embodiment of the production method for a semiconductor device. In the separation step, the laminated body for temporary fixing is irradiated with light through the support member side, and the semiconductor member is separated from the support member.

As shown in FIG. 5(*a*), the laminated body for temporary fixing 20c is irradiated with light A through the support member 22 side to separate the semiconductor member 40 from the support member 22. As a result of irradiation with light A, the light-absorbing layer 12 absorbs light and instantaneously generates heat. Due to the generated heat, for example, melting of the material layer for temporary fixing 10Ac, thermal stress generated between the support member 22 and the semiconductor member 40, and scattering of the light-absorbing layer 12 may occur. One or two or more of these phenomena are the main causes of the occurrence of cohesive peeling, interfacial peeling, and the like, and the semiconductor member 40 can be easily separated from the support member 22. In order to separate the semiconductor member 40 from the support member 22, stress may be slightly applied to the semiconductor member 40 together with irradiation with light A.

The light A in the separation step may be incoherent light. Incoherent light is light that is not coherent, which is electromagnetic waves having properties such as no generation of interference fringes, low coherence, and low directivity. Incoherent light tends to be attenuated as the optical path length is longer. Laser light is generally coherent light, whereas light such as solar light and the light of a fluorescent lamp is incoherent light. The incoherent light can also be considered as light excluding laser light. Since the irradiation area of incoherent light is generally overwhelmingly larger than that of coherent light (that is, laser light), it is possible to decrease the number of times of irradiation. For example, separation of a plurality of semiconductor members 40 can be caused by a single irradiation. The incoherent light may include infrared radiation. The incoherent light may be pulsed light.

The light source of the light is not particularly limited; however, the light source may be a xenon lamp. A xenon lamp is a lamp that utilizes light emission caused by application and discharge in an arc tube having xenon gas encapsulated therein. Since a xenon lamp is discharged while repeating ionization and excitation, it has a stable continuous wavelength from the ultraviolet light region to the infrared light region. Since the xenon lamp requires a shorter start time compared with lamps such as a metal halide lamp, the time related to the process can be shortened to a large extent. Furthermore, since it is necessary to apply a high voltage for light emission, high heat is generated instantaneously; however, the xenon lamp is advantageous even from the viewpoint that the cooling time is short, and continuous work is possible.

The irradiation conditions for the xenon lamp include applied voltage, pulse width, irradiation time, irradiation distance (distance between the light source and the light-absorbing layer), irradiation energy, and the like, and these can be arbitrarily set according to the number of times of irradiation and the like. From the viewpoint of reducing damage to the semiconductor member 40, the irradiation conditions may be set such that the semiconductor member 40 can be separated by a single irradiation.

On the separated semiconductor member 40, a portion of the material layer for temporary fixing 10Ac may adhere as a residue. The adhered residue is removed as shown in FIG. 5(*b*). The adhered residue may be removed by, for example, washing with a solvent, or may be detached by peeling. With regard to the film for temporary fixing of the present embodiment, since the peeling residue after separation of the semiconductor member and the support member can be sufficiently reduced, the film for temporary fixing can be efficiently detached.

On the other hand, the adhered residue may be removed by, for example, washing with a solvent, or may be detached by peeling. The solvent is not particularly limited; however, examples include ethanol, methanol, toluene, xylene, acetone, methyl ethyl ketone, methyl isobutyl ketone, and hexane. These may be used singly or in combination of two or more kinds thereof. In order to remove the adhered residue, the semiconductor member 40 may be immersed in a solvent, or ultrasonic cleaning may be performed. The semiconductor member 40 may also be heated at a low temperature of about 100° C. or lower.

A semiconductor element 60 including a processed semiconductor member 40 can be obtained by the above-exemplified methods. A semiconductor device can be produced by connecting the obtained semiconductor element 60 to another semiconductor element or a substrate for mounting semiconductor elements.

EXAMPLES

Hereinafter, the present disclosure will be more specifically described by way of Examples. However, the present disclosure is not intended to be limited to these Examples.

Examples 1 to 3 and Comparative Examples 1 and 2

[Production and Evaluation of Film for Temporary Fixing]
<Production of Film for Temporary Fixing>
The following components were used for the production of films for temporary fixing.
(A) Thermoplastic Resin
(A-1) Maleic anhydride-modified styrene-ethylene-butylene-styrene block copolymer (trade name: FG1924GT, manufactured by KRATON CORPORATION, styrene content: 13.0% by mass), used as a xylene solution having a concentration of 25% by mass.
(A-2) Maleic anhydride-modified styrene-ethylene-butylene-styrene block copolymer (trade name: FG1901GT, manufactured by KRATON CORPORATION, styrene content: 30.0% by mass), used as a xylene solution having a concentration of 25% by mass.
(B) Thermosetting Resin
(B-1) Naphthalene type epoxy resin (trade name: HP4710, manufactured by DIC Corporation), used as a cyclohexanone solution having a concentration of 50% by mass.
(B-2) Dicyclopentadiene type epoxy resin (trade name: HP7200H, manufactured by DIC Corporation), used as a cyclohexanone solution having a concentration of 50% by mass.
(B-3) Dicyclopentadiene type epoxy resin (trade name: HP7200H, manufactured by DIC Corporation), used as a xylene solution having a concentration of 50% by mass.
(C) Oxidation Inhibitor
(C-1) Hindered phenol derivative (trade name: AO-60, manufactured by ADEKA Corporation), used as a cyclohexanone solution having a concentration of 10% by mass.
(D) Curing Accelerator
(D-1) Imidazole derivative (trade name: 2PZ-CN, manufactured by SHIKOKU CHEMICALS CORPORATION), used as a cyclohexanone solution having a concentration of 10% by mass.

The materials shown in Table 1 were mixed at the proportions shown in Table 1 (the numerical values of Table 1 mean the quantity of non-volatile components) to obtain a varnish of a curable resin component. The obtained varnish of a curable resin component was applied on a release-treated surface of a polyethylene terephthalate (PET) film (PUREX A31, Toyobo Film Solutions, Ltd., thickness: 38 μm) by using a precision coating machine. The coating film was dried by heating at 100° C. for 10 minutes to obtain films for temporary fixing (curable resin films) of Examples 1 to 3 and Comparative Examples 1 and 2.
<Evaluation of Film for Temporary Fixing>
(Measurement of Shear Viscosity)
Shear viscosity was measured by using the films for temporary fixing of Examples 1 to 3 and Comparative Examples 1 and 2. Incidentally, for the measurement of shear viscosity, a film for temporary fixing having a thickness of 500 μm was prepared. The shear viscosity was measured using ARES (manufactured by Rheometric Scientific, Inc.). A measurement sample was produced by punching into a diameter of 9 mm φ. Measurement was performed by increasing the temperature at a temperature increase rate of 5° C./min while applying 5% strain to the measurement sample, and the value observed at 100° C. was designated as the shear viscosity at 100° C. The results are shown in Table 1.
(Measurement of Storage Modulus)
Storage modulus was measured by using the films for temporary fixing of Examples 1 to 3 and Comparative Examples 1 and 2. Incidentally, for the measurement of the storage modulus, a film for temporary fixing having a thickness of 500 μm was prepared. The film for temporary fixing was cut out into a predetermined size (20 mm in length (distance between chucks)×5.0 mm in width) and thermally cured in a clean oven (manufactured by ESPEC CORP.) under the conditions of 180° C. and 2 hours, and thereby a measurement sample, which was a cured product of the film for temporary fixing (curable resin film), was obtained. The storage moduli at 270° C. and 25° C. of the films for temporary fixing (curable resin films) were measured under the following conditions. The results are shown in Table 1.
Apparatus name: Dynamic viscoelasticity measuring apparatus (manufactured by TA Instruments, Inc., RSA-G2)
Measured temperature region: −70° C. to 300° C.
Temperature increase rate: 5° C./min
Frequency: 1 Hz
Measurement mode: Tensile mode
(Evaluation of Embedding Properties)
The embedding properties were evaluated by using the films for temporary fixing of Examples 1 to 3 and Comparative Examples 1 and 2. Incidentally, for the evaluation of embedding properties, a film for temporary fixing having a thickness of 80 μm was prepared. The support film of the film for temporary fixing was detached, and the surface of the film for temporary fixing on the side where the support film had been detached was laminated on a slide glass at 100° C. Next, a semiconductor chip measuring 7.3 mm on each side with a thickness of 150 μm and having a semicircular-shaped level difference of 40 μm on the surface was pressure-bonded onto the film for temporary fixing under the conditions of a temperature of 130° C. and a pressure of 50 N for a time of 10 seconds, such that the surface with the semicircular-shaped level difference was in contact with the film for temporary fixing. Thereafter, the assembly was heated at 130° C. for 30 minutes and subsequently heated at 200° C. for 1 hour to cure the film for temporary fixing, and a sample was obtained. The obtained sample was observed through the slide glass surface, an image was analyzed with Photoshop (registered trademark), and the generation of voids in between the semiconductor chip and the film for temporary fixing was observed. A case where there was generation of voids was rated as "A", and a case where there was no generation of voids was rated as "B". The results are shown in Table 1.

(Evaluation of Creeping Up of Resin Component)

The samples obtained in the evaluation of embedding properties were used to evaluate creeping up of resin components. A prepared sample was cast using an epoxy resin, and a cross-section of slide glass/film for temporary fixing/ a rate of 50 mm/min with a peel testing machine set such that the peel angle was 90°, and this was designated as peel strength. The results are shown in Table 1.

(Observation of Peeling Residue)

For the measurement sample after the peel strength, the surface of the silicon mirror wafer after peeling was observed by visual inspection, and it was checked whether residue was generated. A case where there was no residue on the surface was rated as "A", a case where there was residue on some portion of the surface was rated as "B", and a case where there was residue over the entire surface was rated as "C". The results are shown in Table 1.

TABLE 1

| | | | Exam. 1 | Exam. 2 | Exam. 3 | Comp. Exam. 1 | Comp. Exam. 2 |
|---|---|---|---|---|---|---|---|
| (A) | (A-1) | | 35 | 70 | 52.5 | 35 | 35 |
| | (A-2) | | 35 | — | 17.5 | 35 | 35 |
| (B) | (B-1) | | 15 | — | — | — | — |
| | (B-2) | | 15 | 30 | — | 30 | 30 |
| | (B-3) | | — | — | 30 | — | — |
| (C) | (C-1) | | 0.8 | 0.8 | 0.8 | 0.8 | 0.8 |
| (D) | (D-1) | | 0.5 | 0.5 | 0.5 | 0.5 | 2.0 |
| Content of monomer unit derived from styrene | % by mass (based on hydrocarbon resin) | | 21.5 | 13.0 | 17.3 | 21.5 | 21.5 |
| | % by mass (based on (A) + (B)) | | 15.1 | 9.1 | 12.1 | 15.1 | 15.1 |
| Shear viscosity | 100° C. | Pa · s | 58139 | 3216 | 58665 | 44840 | 55902 |
| Storage modulus | 270° C. | MPa | 3.0 | 1.8 | 1.5 | 1.4 | 1.4 |
| after curing | 25° C. | MPa | 87.0 | 53.6 | 13.4 | 119.0 | 197.0 |
| Problems | Embedding properties | | A | A | A | A | A |
| | Resin creeping up | | A | A | A | B | B |
| Peel strength | N/m | | 330 | 350 | 220 | 520 | 450 |
| Residue after peeling | | | A | A | A | B | C | semiconductor chip was polished so that the cross-section could be observed. The amount of creeping up of resin components in the film for temporary fixing at the time of temporary fixing the semiconductor chip was measured by checking the edges of the semiconductor chip. A case where the amount of resin components creeping up on the side surfaces of the chip was 30 μm or less was rated as "A", and a case where the amount of resin components creeping up on the side surfaces of the chip was more than 30 μm was rated as "B". The results are shown in Table 1.

(Measurement of Peel Strength)

The peel strength was measured by using the films for temporary fixing of Examples 1 to 3 and Comparative Examples 1 and 2. Incidentally, for the measurement of peel strength, a film for temporary fixing having a thickness of 80 μm was prepared. The peel strength was evaluated by measuring the 90° peel strength between a silicon mirror wafer and a film for temporary fixing. A silicon mirror wafer (6-inch) having a thickness of 625 μm was disposed on a stage of a vacuum laminator (manufactured by NPC Incorporated, LM-50X50-S), the support film of the film for temporary fixing was detached, and the film for temporary fixing was disposed such that the surface on the support film side of the film for temporary fixing was in contact with the silicon mirror wafer. The assembly was heated and pressed at a temperature of 120° C. and a pressure of 0.1 MPa for 2 minutes under the conditions of 1.5 kPa (15 mbar), and vacuum lamination was performed to obtain a sample. The obtained sample was subsequently heated at 200° C. for 1 hour to be cured. Thereafter, the sample was cut out into a width of 10 mm and was used as a sample for measurement. The sample for measurement was subjected to a peel test at As shown in Table 1, the films for temporary fixing of Examples whose storage modulus at 270° C. after curing was 1.5 to 20 MPa and whose storage modulus at 25° C. after curing was 1.5 to 150 MPa, were excellent in ter ns of the problems (embedding properties and creeping up of resin component) and in terms of peeling residue. From these results, it was confirmed that the film for temporary fixing of the present disclosure is capable of forming a material layer for temporary fixing that can sufficiently suppress problems when temporarily fixing a semiconductor member and can sufficiently reduce peeling residue after a semiconductor member and a support member are separated.

INDUSTRIAL APPLICABILITY

According to the present disclosure, there is provided a film for temporary fixing capable of forming a material layer for temporary fixing that can sufficiently suppress problems when temporary fixing a semiconductor member and can sufficiently reduce peeling residue after a semiconductor member and a support member are separated. Furthermore, according to the present disclosure, a laminated body for temporary fixing and a method for producing a semiconductor device, both using such a film for temporary fixing, are provided.

REFERENCE SIGNS LIST

10: film for temporary fixing, 10A, 10Ac: material layer for temporary fixing, 12: light-absorbing layer, 20, 20c: laminated body for temporary fixing, 22: support member, 30: laminated body, 40: semiconductor member, 42: semiconductor substrate, 44: rewiring layer, 50: encapsulation layer, 60: semiconductor element.

The invention claimed is:

1. A film for temporary fixing comprising a curable resin component, wherein the curable resin component comprises a thermoplastic resin and a thermosetting resin, a storage modulus at 270° C. after curing is 1.5 to 5 MPa, a storage modulus at 25° C. after curing is 10 to 90 MPa, and the film for temporary fixing is used for temporarily fixing a semiconductor member and a support member.

2. The film for temporary fixing according to claim 1, wherein the thermoplastic resin comprises a hydrocarbon resin having a monomer unit derived from styrene.

3. The film for temporary fixing according to claim 2, wherein a content of the monomer unit derived from styrene is 10% to 22.5% by mass based on a total amount of the hydrocarbon resin.

4. The film for temporary fixing according to claim 2, wherein a content of the monomer unit derived from styrene is 7% to 16% by mass based on a total amount of the curable resin component.

5. A laminated body for temporary fixing, comprising:

the support member;

a material layer for temporary fixing formed from the film for temporary fixing according to claim 1; and a light absorbing layer located between the support member and the material layer.

6. A method for producing a semiconductor device, the method comprising:

preparing the laminated body for temporary fixing according to claim 5;

temporarily fixing a semiconductor member to the support member, with the material layer for temporary fixing interposed therebetween;

processing the semiconductor member temporarily fixed to the support member; and irradiating the laminated body for temporary fixing with light through a support member side to separate the semiconductor member from the support member.

7. The method for producing a semiconductor device according to claim 6, wherein the light is incoherent light.

8. The method for producing a semiconductor device according to claim 7, wherein the incoherent light is light comprising at least infrared light.

9. The method for producing a semiconductor device according to claim 6, wherein a light source of the light is a xenon lamp.

10. The film for temporary fixing according to claim 2, wherein the hydrocarbon resin is a styrene-ethylene-butylene-styrene block copolymer (SEBS).

11. The film for temporary fixing according to claim 1, wherein the thermosetting resin comprises an epoxy resin.

12. The film for temporary fixing according to claim 11, wherein the epoxy resin comprises a dicyclopentadiene type epoxy resin.

13. The film for temporary fixing according to claim 1, wherein a content of the thermoplastic resin is 40 to 90 parts by mass with respect to 100 parts by mass of a total amount of the curable resin component.

14. The film for temporary fixing according to claim 1, wherein a shear viscosity of the film at 100° C. is 3000 to 80000 Pa·s.

15. The method for producing a semiconductor device according to claim 6, wherein the thermoplastic resin comprises a hydrocarbon resin having a monomer unit derived from styrene.

16. The method for producing a semiconductor device according to claim 15, wherein the hydrocarbon resin is a styrene-ethylene-butylene-styrene block copolymer (SEBS).

17. The method for producing a semiconductor device according to claim 6, wherein the thermosetting resin comprises an epoxy resin.

18. The method for producing a semiconductor device according to claim 17, wherein the epoxy resin is a dicyclopentadiene type epoxy resin.

19. The method for producing a semiconductor device according to claim 6, wherein a content of the thermoplastic resin is 40 to 90 parts by mass with respect to 100 parts by mass of a total amount of the curable resin component.

20. The method for producing a semiconductor device according to claim 6, wherein a shear viscosity of the film for temporary fixing at 100° C. is 3000 to 80000 Pa·s.

* * * * *